United States Patent
Knaipp et al.

(10) Patent No.: US 7,898,030 B2
(45) Date of Patent: Mar. 1, 2011

(54) HIGH-VOLTAGE NMOS-TRANSISTOR AND ASSOCIATED PRODUCTION METHOD

(75) Inventors: Martin Knaipp, Unterpremstätten (AT); Jong Mun Park, Graz (AT)

(73) Assignee: austriamicrosystems AG, Underpremstätten (AU)

( * ) Notice: Subject to any disclaimer, the term of this patent is extended or adjusted under 35 U.S.C. 154(b) by 46 days.

(21) Appl. No.: 11/659,512

(22) PCT Filed: Aug. 5, 2005

(86) PCT No.: PCT/EP2005/008542
§ 371 (c)(1),
(2), (4) Date: Jul. 27, 2007

(87) PCT Pub. No.: WO2006/015822
PCT Pub. Date: Feb. 16, 2006

(65) Prior Publication Data
US 2007/0278570 A1    Dec. 6, 2007

(30) Foreign Application Priority Data
Aug. 6, 2004  (DE) .......................... 10 2004 038 369

(51) Int. Cl.
*H01L 29/66* (2006.01)
(52) U.S. Cl. .................. 257/341; 257/E29.031; 438/400
(58) Field of Classification Search .................. 257/341, 257/E29.031; 438/400
See application file for complete search history.

(56) References Cited

U.S. PATENT DOCUMENTS

| | | | |
|---|---|---|---|
| 4,587,713 A | 5/1986 | Goodman et al. | |
| 5,347,155 A | 9/1994 | Ludikhuize | |
| 5,438,215 A | 8/1995 | Tihanyi | |
| 6,100,572 A * | 8/2000 | Kinzer | 257/492 |
| 6,455,893 B1 | 9/2002 | Gehrmann et al. | |
| 6,566,705 B1 * | 5/2003 | Church | 257/314 |

(Continued)

FOREIGN PATENT DOCUMENTS
DE    43 09 764 A1    9/1994

(Continued)

OTHER PUBLICATIONS

Lu, H. et al.: "A 2GHz, 60V-Class, SOI Power LDMOSFET for Base Station Applications", International Symposium on Power Semiconductor Devices (ISPSD 2003), pp. 270-273.

(Continued)

*Primary Examiner* — Thao X Le
*Assistant Examiner* — Matthew Gordon
(74) *Attorney, Agent, or Firm* — Cohen Pontani Lieberman & Pavane LLP

(57) ABSTRACT

An n-conductively doped source region (2) in a deep p-conducting well (DP), a channel region (13), a drift region (14) formed by a counterdoping region (12), preferably below a gate field plate (6) insulated by a gate field oxide (8), and an n-conductively doped drain region (3) arranged in a deep n-conducting well (DN) are arranged in this order at a top side of a substrate (1). A lateral junction (11) between the deep p-conducting well (DP) and the deep n-conducting well (DN) is present in the drift path (14) in the vicinity of the drain region (3) so as to avoid a high voltage drop in the channel region (13) during the operation of the transistor and to achieve a high threshold voltage and also a high breakdown voltage between source and drain.

6 Claims, 3 Drawing Sheets

U.S. PATENT DOCUMENTS

| | | |
|---|---|---|
| 6,756,636 B2 | 6/2004 | Onishi et al. |
| 6,812,524 B2 | 11/2004 | Ahlers et al. |
| 2001/0012671 A1* | 8/2001 | Hoshino et al. ............... 438/305 |
| 2001/0019862 A1* | 9/2001 | Son et al. ...................... 438/163 |
| 2001/0031533 A1* | 10/2001 | Nishibe et al. ................ 438/268 |
| 2003/0017673 A1* | 1/2003 | Cheng et al. .................. 438/297 |

FOREIGN PATENT DOCUMENTS

| | | |
|---|---|---|
| DE | 197 02 102 A1 | 7/1997 |
| DE | 199 29 235 A1 | 1/2001 |
| DE | 100 61 528 C1 | 7/2002 |
| DE | 101 20 030 A1 | 6/2004 |

OTHER PUBLICATIONS

Zhu, R. et al.: "Implementation of High-Side, High-Voltage RESURF LDMOS in a sub-half micron Smart Power Technology", Proceedings of 2001 International Symposium on Power Semiconductor Devices & ICs, Osaka, pp. 403-406.

* cited by examiner

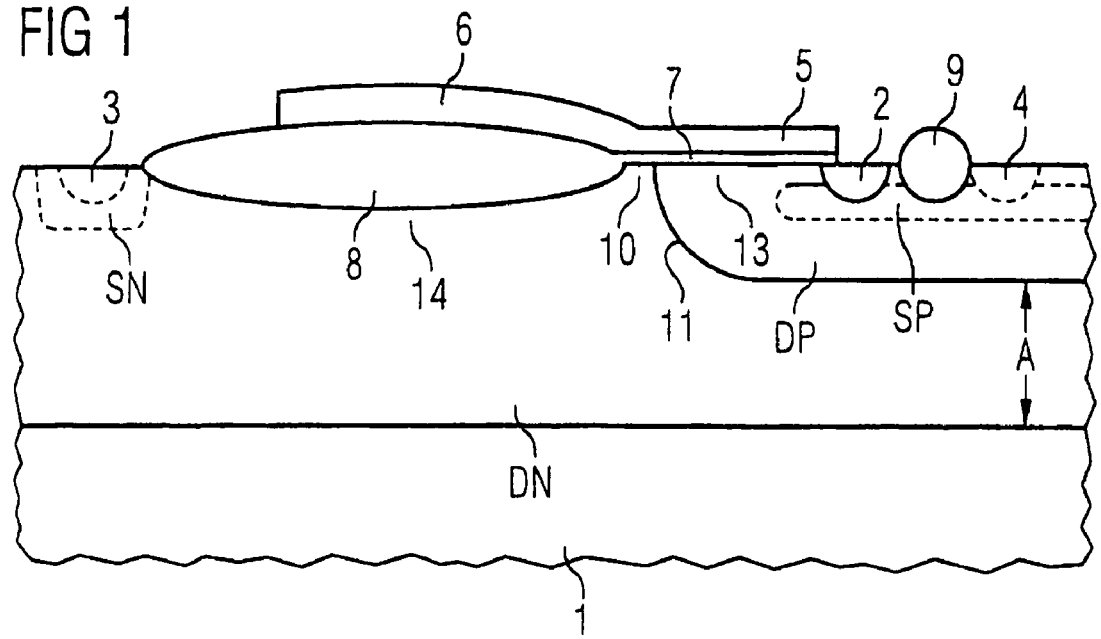
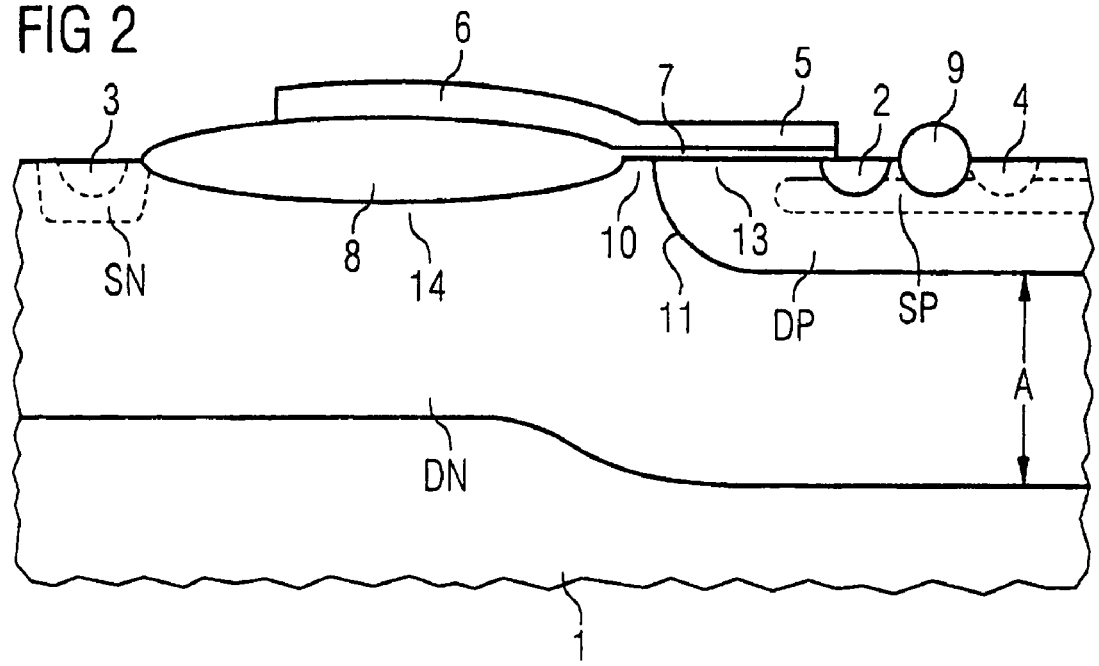

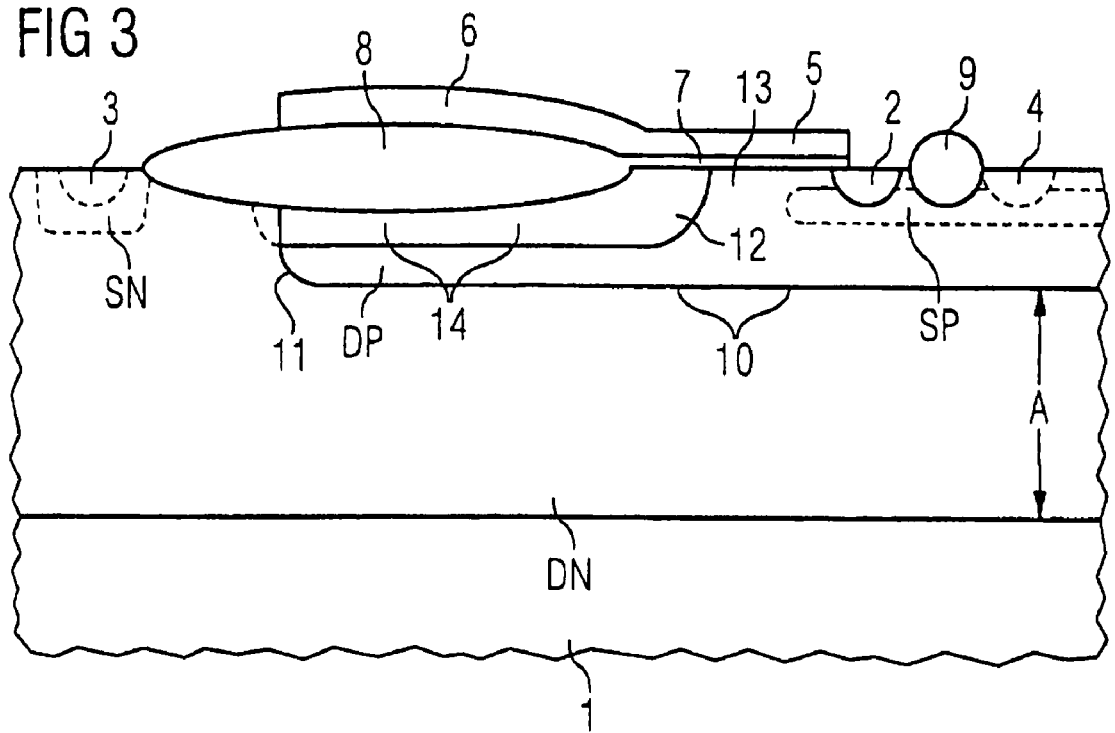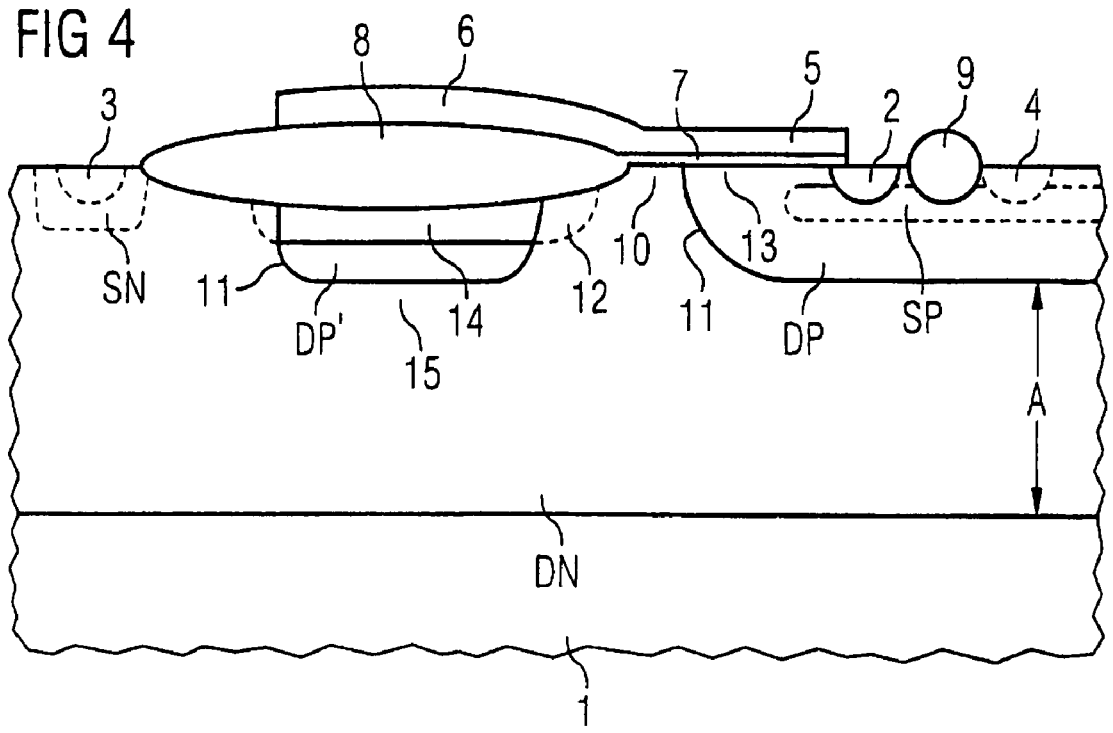

HIGH-VOLTAGE NMOS-TRANSISTOR AND ASSOCIATED PRODUCTION METHOD

RELATED APPLICATIONS

This is a U.S. national stage of application No. PCT/EP2005/008542, filed on Aug. 5, 2005.

This patent application claims the priority of the German patent application 10 2004 038 369.3 filed Aug. 6, 2004 the disclosure content of which is hereby incorporated by reference.

FIELD OF THE INVENTION

The invention relates to a lateral high-voltage NMOS transistor comprising a p-conducting well arranged in an n-conducting well, a channel region, a gate electrode with gate field plate, said gate electrode being insulated from the channel region, an n-conducting source region in the p-conducting well and an n-conducting drain region in the n-conducting well.

BACKGROUND OF THE INVENTION

A lateral high-voltage NMOS transistor in which source, channel and drain are arranged alongside one another at the top side of a p-type substrate is known for example from U.S. Pat. No. 6,455,893 B1. A drain-side edge of the gate electrode is arranged on a field plate. The source and drain regions are n-conducting, and the drain region is arranged in a likewise n-conducting drain extension region, which continues as far as a drift path, which runs subsequently to the channel region below the field plate.

The publication by R. Zhu et al.: "Implementation of High-Side, High-Voltage RESURF LDMOS in a sub-half Micron Smart Power Technology" in Proceedings of 2001 International Symposium on Power Semiconductor Devices & ICs, Osaka, pp. 403-406, describes a high-voltage NMOS transistor in which a p-type body region with an n$^+$-type source region and an n-type well with an n$^+$-type drain region arranged therein are present. The p-type body region may be arranged in the n-type well or, in the case of a novel configuration by comparison therewith, in further p-conducting regions. A p-conducting channel region is controlled by means of a gate electrode drawn partly onto a field oxide arranged between the drain region and the channel region.

The publication by H. Lu and C. A. T. Salama: "A 2 GHz, 60 V-Class, SOI Power LDMOSFET for Base Station Applications" in International Symposium on Power Semiconductor Devices (ISPSD) 2003, pages 270-273, describes an LDD extension high-voltage component in which there is not a field oxide present between the drain region and the channel region, but rather an LDD region (lightly doped drain), which is n$^-$-doped and adjoins the n$^+$-doped drain region. This component is provided for radiofrequency applications.

U.S. Pat. No. 6,097,063 describes a high-voltage NMOS transistor in which a deep n-conductively doped well and therein a p-conductively doped well are formed in a weakly p-conductively doped substrate, an n-conductively doped source region, an n-conductively doped drain region and a channel region adjoining the source region and also a gate electrode, which is arranged above the channel region and is electrically insulated from the channel region, are present and a drift path is present between the channel region and the drain region. A portion of the drift path is formed by an n-conducting layer on the p-conductively doped well, which is produced by thermally oxidizing the p-conducting top side of the substrate. This exploits the fact that phosphorus ions distributed non-uniformly and boron ions that are resolved or distributed in the lattice are present there, which are distributed uniformly by the oxidation.

DE 199 29 235 A1 describes a vertical DMOS transistor which is insulated from adjoining components by insulating regions.

U.S. Pat. No. 5,438,215 describes a power MOSFET in which more highly doped regions of an opposite conduction type to the rest of the inner zone are arranged in the region of the space charge zone. Situated in between are zones which are of the conduction type of the inner zone but have a higher doping.

U.S. Pat. Nos. 6,812,524 and 6,756,636 describe high-voltage NMOS transistors in which p-type strips isolated from a deep p-conductively doped well are present in the drift zone.

U.S. Pat. No. 5,347,155 describes a power semiconductor component having a frame-type drain region.

U.S. Pat. No. 6,100,572 describes a power MOSFET having a shallow p-conductively doped well, into which the source region projects.

It is often desirable to use a high-voltage NMOS transistor instead of a high-voltage PMOS transistor. However, the high-voltage NMOS transistors likewise exhibit the problem that the operating properties and the electrical properties, in particular the non-reactive resistance in the on state, the capability of resisting so-called latch-up and the occurrence of a source-drain breakdown, cannot be optimized simultaneously. It is necessary, therefore, to make a certain compromise between these properties.

SUMMARY OF THE INVENTION

It is one object of the present invention to provide a high-voltage NMOS transistor of the type described in the introduction which has a higher source-drain breakdown voltage, but at the same time has improved latch-up properties and can be produced advantageously. Another object of the invention is to provide a suitable production method for such a transistor.

These and other objects are attained in accordance with one aspect of the present invention directed to a high-voltage NMOS transistor comprising: a deep n-conductively doped well and therein a deep p-conductively doped well formed in a semiconductor body or substrate at a top side, an n-conductively doped source region arranged in the deep p-conductively doped well, a channel region adjoining the source region, a gate electrode above the channel region, said gate electrode being electrically insulated from the channel region, an n-conductively doped drain region arranged on a side of the channel region opposite to the source region, a drift path between the channel region and the drain region, wherein a portion of the deep p-conductively doped well is present along the drift path, a drain-side interface of the deep p-conductively doped well arranged in the region of the drift path, a counterdoping region implanted with donors overlaps a region of the deep p-conductively doped well that is present at the top side of the semiconductor body or substrate and which forms at least one portion of the drift path, and a drain-side interface of the counterdoping region is arranged in the region of the drift path and the drain region is situated in a shallow n-conductively doped well arranged in the deep n-conductively doped well at a distance from the counterdoping region.

Another aspect of the present invention is directed to a method for the production of a high-voltage NMOS transistor comprising the steps of: in a semiconductor body or substrate at a top side by implantations of dopant, a deep n-conductively doped well is produced, a deep p-conductively doped well is produced, and a shallow n-conductively doped well is produced, wherein the deep p-conductively doped well is arranged in the deep n-conductively doped well such that a lower interface—present at a distance from the top side—of the deep p-conductively doped well is situated at a distance (A) above a lower interface of the deep n-conductively doped well, and a portion of the deep p-conductively doped well encompasses a channel region provided and a region provided for a drift path, arranging an n-conductively doped source region in the deep p-conductively doped well, arranging a drain region in the shallow n-conductively doped well, arranging a gate dielectric over the channel region, and arranging a gate electrode on the gate dielectric, wherein in order to form a drift path between the channel region and the drain region with the implantation of the shallow n-conductively doped well at the top side of the semiconductor body or substrate, a counter doping region is formed, which overlaps a top-side region of the deep p-conductively doped well and is arranged at a distance separately from the shallow n-conductively doped well.

For a more detailed explanation of the functioning of the high-voltage NMOS transistor and of the problem solved according to the invention, a description is given below firstly of a high-voltage NMOS transistor in accordance with a fundamentally advantageous structure with reference to the accompanying FIGS. 1 and 2.

FIG. 1 shows an excerpt from a cross section through a high-voltage NMOS transistor. In the case of this component, a deep n-conductively doped well DN is formed at a top side of a semiconductor body or substrate 1. Arranged within the deep n-conductively doped well DN is a deep p-conductively doped well DP, which, however, reaches only a smaller depth than the deep n-conductively doped well DN. The distance A marked in FIG. 1 is situated between an essentially planar lower boundary area of the deep n-conductively doped well DN and a likewise essentially planar lower boundary or junction area between the deep p-conductively doped well DP and the deep n-conductively doped well DN, which distance must not be too large and must not be too small, in order to ensure suitable operating properties of the component.

If the distance A is chosen to be too small, the so-called latch-up occurs particularly in the case of a substrate 1 provided with a p-type basic doping, the vertical pnp transistor formed by the doped regions running on in the case of said latch-up. This results in an impairment of the functioning of the high-voltage NMOS transistor. A large distance A additionally improves the resistance of the transistor in the on state. In order to ensure the functioning of the transistor in the range provided for the operating voltages, however, the distance A must not become too large. The depths of the deep n-conductively doped well DN and of the deep p-conductively doped well DP are governed, on the other hand, by further boundary conditions of the production process. Particularly if high-voltage PMOS transistors are intended to be integrated with the component and the number of method steps must not be increased or must not be significantly increased, the depths of said wells and the doping profiles thereof are essentially predefined.

In the case of a particularly deep p-conductively doped well DP, the pn junction—designated as junction 11—between the wells is relatively steep at the side and has a large vertical extent. That is disadvantageous for the functioning of the high-voltage NMOS transistor.

Firstly the remaining elements of the transistor will be specified below. An n-conductively doped source region 2 is arranged in the deep p-conducting well DP at the top side. Arranged within the deep p-conductively doped well DP there is preferably a shallow p-conductively doped well SP, which is formed in layer-like fashion and is more highly doped than the deep p-conductively doped well DP. The source region 2 dips a little way into said shallow p-conductively doped well SP. The shallow p-conductively doped well SP may be provided with a $p^+$-conductively doped body region 4 provided for an external connection (ground) of the p-type wells. In the example illustrated, for insulation purposes, a field oxide 9 composed of the oxide of the relevant semiconductor material, preferably silicon dioxide, is present between the source region 2 and the body region 4.

In a manner adjoining the source region 2, the channel region 13 is situated at the top side of the substrate 1 within the deep p-conductively doped well DP. Situated at the top side is a thin gate dielectric 7, on which the gate electrode 5 is arranged. For better setting of the electric field, in particular for reduction of the electric field strength at the top side in a region provided as drift path 14 for the charge carriers, a gate field oxide 8 is situated at the top side of the substrate, a gate field plate 6 electrically conductively connected to the gate electrode 5 being arranged on said gate field oxide.

FIG. 1 illustrates a shallow n-conductively doped well SN around the drain region 3, said well being more lightly doped than the drain region 3 and more highly doped than the deep n-conductively doped well DN. With such a shallow n-conductively doped well SN, it is possible to bring about a less abrupt transition between the high n-type doping of the drain region 3 and the lower n-type doping of the deep n-conductively doped well.

This transistor exhibits the problem that a high electric field strength occurs at the high and steep lateral junction 11 at the end of the channel during operation of the transistor. At this location, therefore, there is a critical breakdown region 10 present, in which a great voltage drop occurs when an electrical voltage is present in the reverse direction between source and drain, which voltage drop can reduce the threshold voltage of the transistor or even lead to the occurrence of a short-circuit-like current and to the destruction of the transistor.

FIG. 2 illustrates a cross section corresponding to FIG. 1 through an alternative embodiment of such a high-voltage NMOS transistor, in which, in contrast to the embodiment in accordance with FIG. 1, the distance A is increased by virtue of the lower boundary area of the deep n-conductively doped well DN lying deeper below the deep p-conductively doped well DP. As a result, although this part of the transistor is optimized, the breakdown region 10 at the end of the channel is present in this case, too.

In the case of the high-voltage NMOS transistor according to the invention, the steep drain-side interface between the deep n-conductively doped well and the deep p-conductively doped well is shifted into the region of the drift path, in particular into the region below the gate field oxide. What is thereby achieved is that a higher voltage drop occurs in the vicinity of the drain region during operation of the transistor. The voltage drop is thus distributed more uniformly over the entire source-drain path, which increases the breakdown voltage. The deep p-conductively doped well may also be present in two separate portions. A source-side portion of the deep p-conductively doped well corresponds approximately to the deep p-conductively doped well DP illustrated in FIG. 1. A drain-side portion is situated at a distance from the source-side portion in the region of the drift path, in particular below the gate field oxide. The drift path comprises a counterdoping region in the deep p-conductively doped well, if appropriate in addition to a current path which is present between portions of the deep p-conductively doped well, and which continues below a drain-type portion of said well. In the case of the embodiment mentioned last, the counterdoping region for the drift path is present in the drain-side portion of the deep p-conductively doped well. The counterdoping region is formed for reducing the p-type conductivity and for obtaining a sufficiently high charge carrier flow below the gate field oxide at least in the upper region of the deep p-conductively doped well DP by introduction of dopant for n-type conduction, with the result that overall a sufficient conductivity for electrons is produced there. The implantation of doping for forming the counterdoping region is preferably effected after the production of the gate field oxide.

An embodiment comprising a gate field oxide is preferred, but the gate field oxide and the gate field plate may, in principle, also be omitted in the manner of an LDD (lightly doped drain) extension component known per se, in which the drift path is not covered by a conductor connected to the gate electrode.

BRIEF DESCRIPTION OF THE DRAWINGS

FIG. 1 shows a cross section of a high-voltage NMOS transistor with a breakdown region in the channel.

FIG. 2 shows a further exemplary embodiment of the transistor in accordance with FIG. 1 in cross section.

FIG. 3 shows a cross section of a first exemplary embodiment of a high-voltage NMOS transistor according to the invention.

FIG. 4 shows a cross section corresponding to FIG. 3 through a further exemplary embodiment of the high-voltage NMOS transistor according to the invention.

DETAILED DESCRIPTION OF THE DRAWINGS

Figure 5:
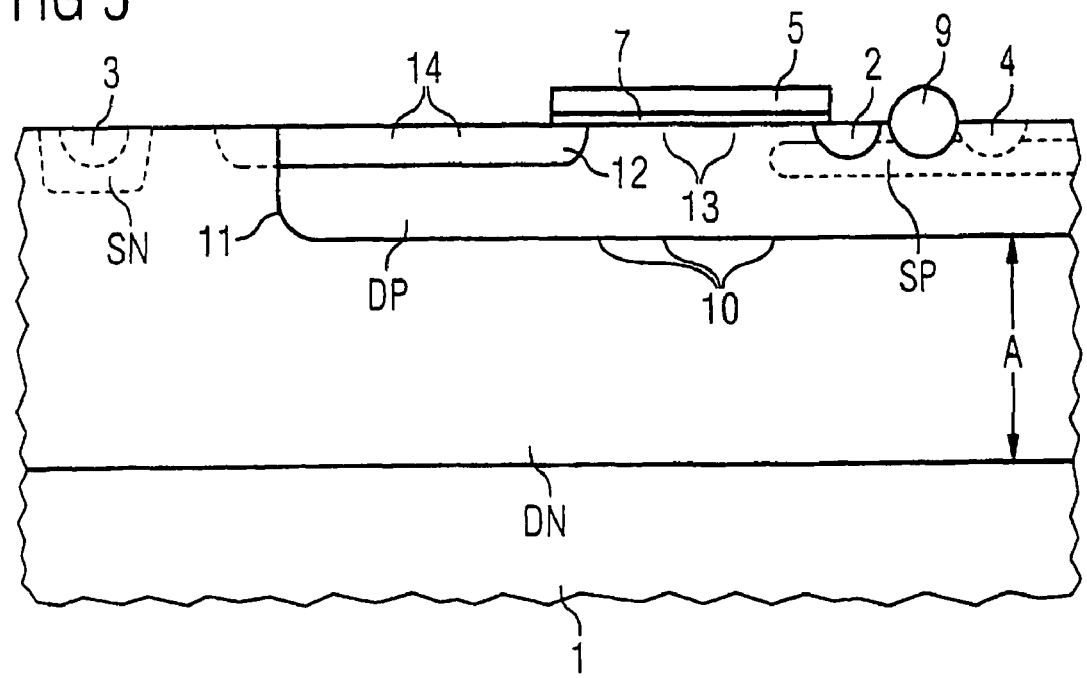
FIG. 5 shows a cross section in accordance with FIG. 3 for an exemplary embodiment without a gate field plate.

FIG. 3 shows a cross section corresponding to the cross section of FIG. 1 for a first exemplary embodiment of the high-voltage NMOS transistor according to the invention. The reference symbols entered designate the corresponding elements that have already been described with reference to FIG. 1. They are therefore indicated again only for the sake of completeness. A deep n-conductively doped well DN and therein deep p-conductively doped well DP are formed in a semiconductor body or substrate 1 at the top side, the lower boundary areas of said wells being at a distance A from one another. In this exemplary embodiment, there is situated in the deep p-conductively doped well DP preferably a shallow more highly p-conductively doped well SP, in and above which the n-conductively doped source region 2 is arranged. A highly p-conductively doped body region 4 may be provided for connection of the shallow p-conductively doped well SP. An insulation region, here a field oxide 9, is preferably situated between the source region 2 and the body region 4. The drain region 3 is n-conductively doped and preferably arranged in a shallow n-conductively doped well SN at the top side. The dopant concentration of the shallow n-conductively doped well lies between the higher dopant concentration of the drain region 3 and the lower dopant concentration of the deep n-conductively doped well DN. Situated between source and drain is the channel region 13 and above that the gate electrode 5, which is electrically insulated from the semiconductor material by the gate dielectric 7 and, if appropriate, is electrically conductively connected to a gate field plate 6 on the gate field oxide 8. With regard to the fact that the shallow n-conductively doped well SN is preferably implanted through the gate field oxide 8, the gate field oxide 8 is formed with a thickness of at most 0.5 µm and is produced after the production of the deep n-conductively doped well DN and the deep p-conductively doped well DP and before the production of the shallow n-conductively doped well SN for example by means of thermal oxidation of the semiconductor material. The deep n-conductively doped well DN is produced using a first mask, referred to here as DN mask, the deep p-conductively doped well DP is produced using a second mask, referred to here as DP mask, and the shallow n-conductively doped well SN is produced using a third mask, referred to here as SN mask, by implantations of dopant. A fourth mask, referred to here as SP mask, is correspondingly used for the implantation of the shallow p-conductively doped well SP. The masks are patterned in a manner known per se in each case according to the regions to be produced.

One difference from the transistor of the type described in the introduction is that the deep p-conductively doped well DP is drawn into the drift path 14 below the gate field oxide 8 to an extent such that the vertical portion of the junction 11 is arranged in the vicinity of the drain region 3. A donor region in the drift path 14 below the gate field oxide 8, which is suitable for the conducting away of electrons toward the drain, is formed by a counterdoping region 12 into which dopant atoms (donors) provided for n-type conductivity are introduced. Their concentration is chosen such that in the region in which the counterdoping region 12 overlaps the deep p-conductively doped well DP, overall a sufficient n-type conductivity is established and electrons can flow there from source to drain. In the final formation of the doping regions, the available acceptors of the deep p-conductively doped well DP preferably exceed the available donors of the shallow n-conductively doped well SN. This results in a net acceptor concentration that reduces the field strength in the breakdown region (10). The potential drop between source and drain is hence shifted towards the drain.

In the figures, boundaries between n-conducting region and p-conducting region are in each case depicted in solid fashion, while the boundaries between regions having the same conductivity type but different dopant concentrations are depicted in dashed fashion.

Accordingly, the counterdoping region 12 illustrated in FIG. 3 outside the deep p-conductively doped well DP is depicted with a dashed contour.

In this embodiment, the breakdown region 10 is that interface between the deep p-conductively doped well DP and the deep n-conductively doped well DN which is present below the channel region 13. A high field strength in the critical region at the end of the channel region 13 is avoided in this way and the breakdown voltage between source and drain is significantly increased. The electric field is distributed more uniformly over the entire region between source and drain, and, in particular, a sufficiently low field strength is present in the drift region 14 of the charge carriers that is present below the gate field oxide 8. The distance A between the lower interfaces of the deep p-conductively doped well and the deep n-conductively doped well can be maximized. In this way, different operating properties are optimized simultaneously in the case of the transistor.

FIG. 4 shows an alternative exemplary embodiment in cross section, in which the deep p-conductively doped well DP is interrupted at the end of the channel region 13. A drain-side portion (DP') of the deep p-conductively doped well is situated below the gate field oxide 8, with the result that in this exemplary embodiment, two vertical junctions 11 of the interfaces of the p-conductively doped well are present on the side toward the drain region. Since, however, a significant voltage drop already occurs at the junction depicted on the left in FIG. 4, said junction being nearer to the drain region, an excessively high voltage no longer occurs in the breakdown region 10 at the end of the channel. In this embodiment, too, the breakdown voltage is therefore significantly greater than in conventional high-voltage NMOS transistors. A counter-doping region 12 is present for forming the drift path 14 in this exemplary embodiment, too. The counterdoping region 12 is in this case provided for the drain-side portion DP' of the deep p-conductively doped well. When the transistor is switched on, the electrons flow along the upper drift path 14 formed by the counterdoping region 12, and also along a further drift path 15 leading through the deep n-conductively doped well DN below the drain-side portion DP' of the p-conductively doped well. The current is therefore divided into two sections or current paths. As in the exemplary embodiment of FIG. 3, in the exemplary embodiment of FIG. 4, too, the voltage drop in the breakdown region 10 is reduced by the vertical portion of the junction 11 arranged near to the drain region 3 in such a way as to result in an electric field distribution that is sufficiently uniform for a high breakdown voltage between source and drain.

Figure 6:
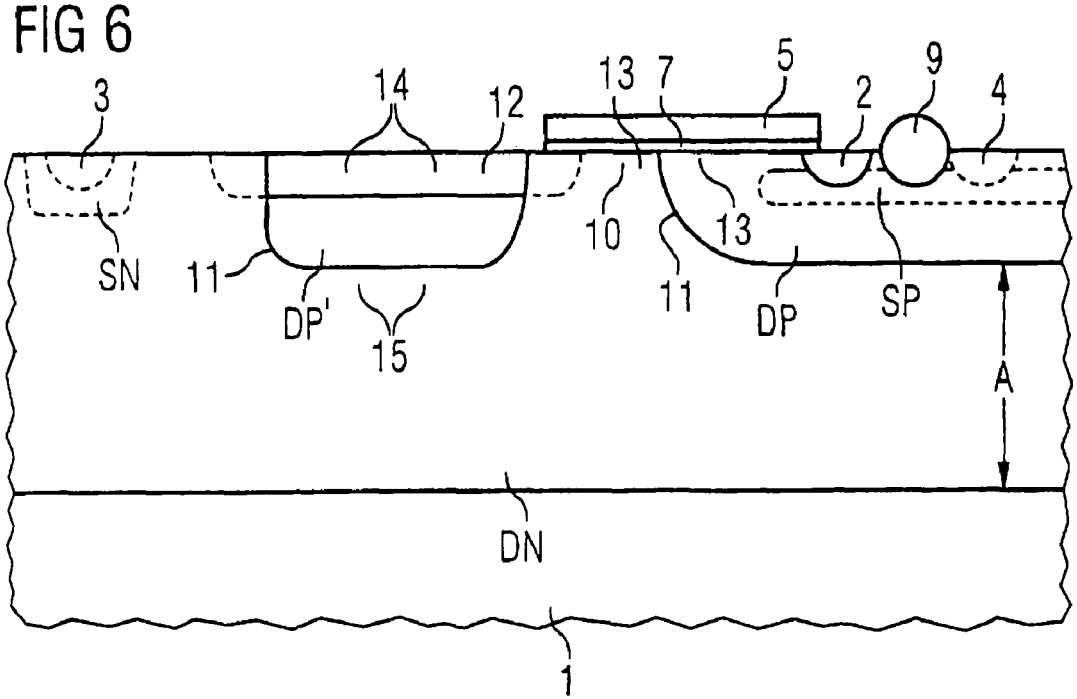
FIG. 6 shows a cross section in accordance with FIG. 4 for an exemplary embodiment without a gate field plate.

The exemplary embodiments illustrated in cross section in FIGS. 5 and 6 correspond to the exemplary embodiments of FIGS. 3 and 4, respectively, with the exception of the absence of the gate field plate and the gate field oxide. In this case, the semiconductor surface is planar above the drift path 14. The embodiments with gate field oxide and gate field plate are preferred; however, the configurations illustrated in FIGS. 5 and 6 lie within the scope of the invention.

Which embodiment of the high-voltage NMOS transistor according to the invention is particularly preferred also depends on the accuracy of the phototechnology used. In the exemplary embodiments in accordance with FIGS. 3 to 6, the performance of the transistor depends on the positioning accuracy, the overlay, of two masks for DP and SN. The more dopants are implanted into the same volume, the greater the error of the average variation.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A high-voltage NMOS transistor comprising:
   a deep n-conductively doped well (DN) and therein a deep p-conductively doped well formed in a semiconductor body or substrate at a top side;
   an n-conductively doped source region arranged in the deep p-conductively doped well;
   a channel region adjoining the source region;
   a gate electrode above the channel region, said gate electrode being electrically insulated from the channel region;
   an n-conductively doped drain region arranged on a side of the channel region opposite to the source region; and
   a drift path between the channel region and the drain region;
   wherein a portion of the deep p-conductively doped well is present along the drift path;
   a drain-side interface of the deep p-conductively doped well is arranged in a region of the drift path;
   a counterdoping region having an n-type conductivity implanted with donors overlaps a region of the deep p-conductively doped well that is present at the top side of the semiconductor body or substrate, and forms at least one portion of the drift path; and
   wherein the drain-side interface of the counterdoping region having the n-type conductivity is arranged in the region of the drift path, and the drain region is situated in a shallow n-conductively doped well arranged in the deep n-conductively doped well at a distance from the counterdoping region.

2. The high-voltage NMOS transistor as claimed in claim 1, wherein a gate field oxide having a maximum thickness of 0.5 μm is present over the drift path.

3. A method for the production of a high-voltage NMOS transistor comprising the steps of:
   producing, in a semiconductor body or substrate at a top side by implantations of dopant, a deep n-conductively doped well;
   producing a deep p-conductively doped well;
   producing a shallow n-conductively doped well using an SN mask, wherein the deep p-conductively doped well is arranged in the deep n-conductively doped well (DN) such that a lower interface, which is present at a distance from the top side, of the deep p-conductively doped well is situated at a distance (A) above a lower interface of the deep n-conductively doped well, and a portion of the deep p-conductively doped well encompasses a channel region provided and a region provided for a drift path;
   arranging an n-conductively doped source region in the deep p-conductively doped well;
   arranging a drain region in the shallow n-conductively doped well;
   arranging a gate dielectric over the channel region; and
   arranging a gate electrode on the gate dielectric,
   wherein a counterdoping region having an n-type conductivity forms a drift path between the channel region and the drain region via the implantation of the shallow n-conductively doped well at the top side of the semiconductor body or substrate, the counterdoping region overlapping a top-side region of the deep p-conductively doped well and being arranged at a distance separately from the shallow n-conductively doped well.

4. The method as claimed in claim 3, further comprising the steps of:
   producing a shallow p-conductively doped well in the deep p-conductively doped well on that side of the channel region which faces the source region, by implantation of dopant; and
   producing the source region in a manner adjoining the shallow p-conductively doped well.

5. The method as claimed in claim 3, wherein a gate field oxide is produced between the channel region and the drain region on the top side of the semiconductor body or substrate, and wherein the implantation of dopant for forming the counterdoping region is effected after the production of the gate field oxide.

6. The method as claimed in claim 5, wherein a gate field oxide is produced after the production of the deep n-conductively doped well (DN) and the deep p-conductively doped well, and wherein the shallow n-conductively doped well is produced by an implantation through the gate field oxide.

* * * * *